United States Patent
Chang et al.

(10) Patent No.: US 10,794,954 B1
(45) Date of Patent: Oct. 6, 2020

(54) SYSTEM AND METHOD FOR ACCELERATING TIMING-ACCURATE GATE-LEVEL LOGIC SIMULATION

(71) Applicant: Avery Design Systems, Inc., Tewksbury, MA (US)

(72) Inventors: Kai-Hui Chang, Andover, MA (US); Hong-zu Chou, Taipei (TW); Yueh-Shiuan Tsai, Hsinchu (TW)

(73) Assignee: Avery Design Systems, Inc., Tewksbury, MA (US)

( * ) Notice: Subject to any disclaimer, the term of this patent is extended or adjusted under 35 U.S.C. 154(b) by 0 days.

(21) Appl. No.: 16/557,971

(22) Filed: Aug. 30, 2019

Related U.S. Application Data

(60) Provisional application No. 62/725,398, filed on Aug. 31, 2018.

(51) Int. Cl.
| | |
|---|---|
| *G01R 31/30* | (2006.01) |
| *G06F 30/30* | (2020.01) |
| *G01R 31/3183* | (2006.01) |
| *G01R 31/317* | (2006.01) |
| *G06F 30/33* | (2020.01) |
| *G06F 30/398* | (2020.01) |

(52) U.S. Cl.
CPC ........... *G01R 31/318357* (2013.01); *G01R 31/31704* (2013.01); *G01R 31/318364* (2013.01); *G06F 30/30* (2020.01); *G06F 30/33* (2020.01); *G06F 30/398* (2020.01)

(58) Field of Classification Search
CPC . G06F 30/33; G06F 30/30; G01R 31/318357; G01R 31/31704; G01R 31/318364
USPC .................................................. 716/106, 108
See application file for complete search history.

(56) References Cited

U.S. PATENT DOCUMENTS

| | | | |
|---|---|---|---|
| 6,249,898 B1* | 6/2001 | Koh et al. ........ | G01R 31/31835 716/109 |
| 6,865,525 B1* | 3/2005 | Zhong ..................... | G06F 30/33 703/14 |
| 2003/0188299 A1* | 10/2003 | Broughton et al. .... | G06F 8/443 717/141 |
| 2009/0150136 A1* | 6/2009 | Yang ....................... | G06F 30/33 703/13 |
| 2011/0184713 A1* | 7/2011 | Yang ....................... | G06F 30/33 703/13 |
| 2013/0007549 A1* | 1/2013 | Chan ..................... | G06F 11/261 714/741 |

* cited by examiner

*Primary Examiner* — Sun J Lin

(74) *Attorney, Agent, or Firm* — Loginov & Associates, PLLC; William A. Loginov

(57) ABSTRACT

A computer executable tool analyzes a gate-level netlist and uses an analysis result for accelerating a timing-accurate gate-level logic simulation via a parallel processing. The analysis identifies the following elements in the gate-level netlist: (1) netlist wires at partition boundaries for a value propagation; (2) netlist wires whose activities should be suppressed for a better performance; and (3) upstream FFs for partition boundaries to reduce a synchronization overhead. This information is then used to improve a parallel simulation performance.

18 Claims, 4 Drawing Sheets

1. Each partition sends inout/output port value changes to other partitions and update its own input/inout port values according to values from other partitions.
2. After all port values are updated and propagated, each partition sends its next event time to a central scheduler. The central scheduler identifies the smallest next event time and sends the time to all partitions.
3. Each partition advances its simulation time to the next event time sent from the scheduler then continues to step 1. This process repeats until simulation ends.

FIG. 1

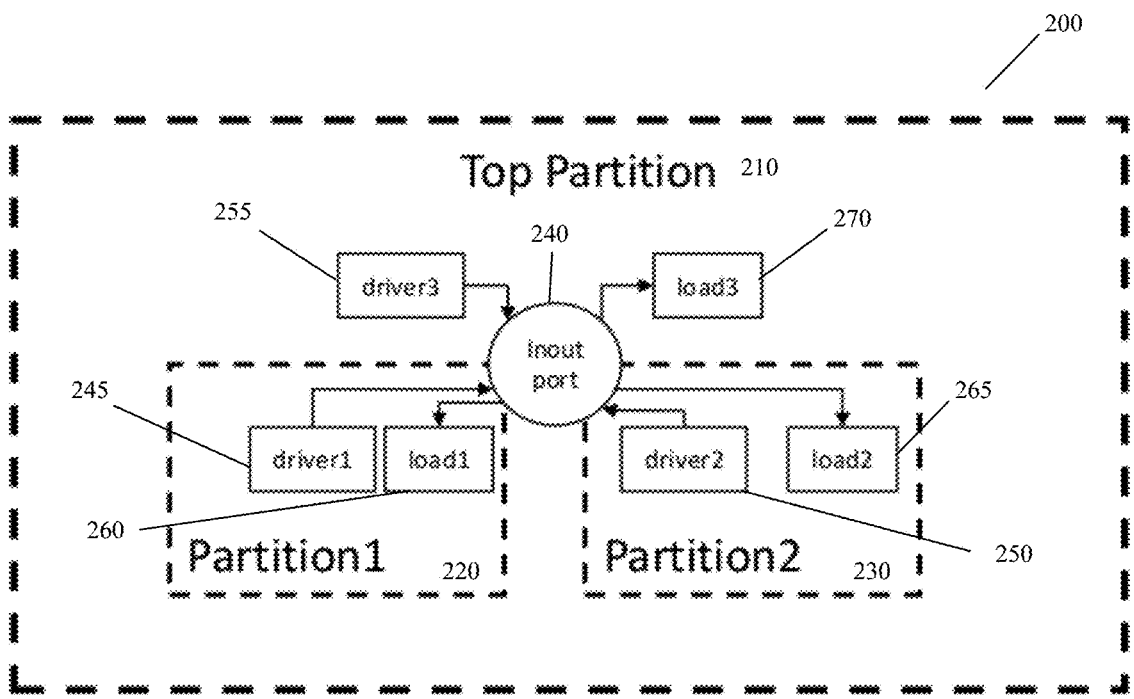

Fig. 2

SYSTEM AND METHOD FOR ACCELERATING TIMING-ACCURATE GATE-LEVEL LOGIC SIMULATION

RELATED APPLICATIONS

This application claims the benefit of U.S. Provisional Application Ser. No. 62/725,398, filed Aug. 31, 2018, entitled SYSTEM AND METHOD FOR ACCELERATING TIMING-ACCURATE GATE-LEVEL LOGIC SIMULATION, the entire disclosure of which is herein incorporated by reference.

FIELD OF THE INVENTION

The invention relates generally to integrated circuit design and, most particularly, to techniques for accelerating timing-accurate gate-level logic simulation using multi-process parallel processing.

BACKGROUND OF THE INVENTION

Logic simulation is one of the most commonly used methods for verifying the correctness of circuit designs. In logic simulation, input patterns to a circuit are provided, and logic simulation produces output patterns from the circuit design code. The output values are then checked against golden results to verify design correctness. As designs get large, logic simulation speed becomes a bottleneck in design verification. This issue is especially serious in timing-accurate gate-level simulation due to the huge number of simulation events created by different delays among wires as well as much more design elements that need to be simulated from buffers and other constructs inserted during physical design stage. For large designs, it can take days or even weeks to simulate a test in timing-accurate mode.

Parallel simulation is one way to accelerate logic simulation. Chang et al., *"Parallel Logic Simulation—A Myth or Reality?"*, IEEE Computer, Apr. 2012, provides good overview of parallel logic simulation methods including discussions on the factors that affect the speed up that can be provided by parallel logic simulation.

Parallel gate-level logic simulation can be fine-grain multi-thread that typically focuses on simulating different gates in parallel. Alternatively, it can be coarse-grain multi-process that focuses on simulating different major design blocks in parallel. This invention focuses on accelerating logic simulation using the latter method.

A typical multi-process parallel simulation method is shown in FIG. 1. To apply this simulation method, a design is typically split to several partitions along block boundaries. These partitions are then simulated in parallel. This generic method does not consider several issues specific to timing-accurate gate-level simulation, thus limiting its performance and practicality. The issues are as follows.

First, the method propagates partition values at block boundaries using ports. However, timing information produced by timing analysis tools, typically saved in Standard Delay Format (SDF) files, usually describes delays between gate terminals instead of module ports. This is because in real circuits, ports are pass-through virtual concepts and do not exist physically in the final layout of the circuit. As a result, either the SDF file needs to be modified to handle the delay, or simulation results will have some timing difference at partition boundaries.

Second, the SDF file needs to be partitioned based on how the design is partitioned. This introduces an extra step and delay values at partition boundaries may be an issue: delay for two signals in different partitions need to be handled after the design is partitioned.

Third, in timing-accurate simulation, there can be a large number of synchronization points in a cycle because any small delay between two gate terminals will create an event. However, the number of events at each synchronization point is typically small. This reduces workload at any given time point and increases communication overhead, and both hurt parallel simulation performance.

To address the issues described above, in this invention we propose new techniques that preserve timing information, do not require explicit design/SDF file partitioning, and can reduce communication overhead.

SUMMARY OF THE INVENTION

This invention overcomes disadvantages of the prior art method by not explicitly partitioning the design or SDF file to preserve full design and timing information. This simplifies the partitioning step and the same compiled design can be used for different partitions. In this invention, each partition simulates its designated part of the design while activities in other parts of the design not to be simulated in the partition are suppressed. To preserve timing, instead of propagating port value changes that can cause timing difference, in this invention we propagate values at drivers of ports that are gate terminals. To suppress unneeded simulation workload in a partition, we disallow value changes for certain wires to eliminate activities in blocks not to be simulated. Finally, we propose to use activities on FFs that drive partition boundaries to determine whether synchronization points can be skipped for the current cycle, which can reduce communication overhead.

BRIEF DESCRIPTION OF THE DRAWINGS

For a more complete understanding of the invention, reference should be made to the following detailed description and accompanying drawing figures, in which like reference numerals identify like elements in the figures, and in which:

FIG. 1 presents a typical coarse-grain multi-process parallel simulation method.

FIG. 2 presents an example design with an inout port shared among top partition, partition1, and partition2. The inout port has three drivers: driven in partition1, driver2 in partition2, and driver3 in top partition. The inout port has three loads: load1 in partition1, load2 in partition2, and load3 in top partition.

DETAILED DESCRIPTION

The goal of this invention is to address issues specific to timing-accurate gate-level simulation when coarse-grain multi-process parallel simulation method is applied. In contrast to generic methods that require the design and SDF file to be explicitly partitioned, this invention preserves the design and SDF file, and it works as follows.

First, for each partition, trace drivers of all output ports at partition boundary until gate terminals are reached. These gate terminals are called "send list" and their value changes, instead of port values, are sent to other partitions. Because delays in SDF files are typically between gate terminals, this ensures that delays between signals in the send list and their downstream logic can be preserved.

For inout ports that are used in multiple partitions, one partition is chosen. Drivers of the inout port, if in other partitions, are added to that partition's send list. In this way, the chosen partition will have all driver values that control the inout port, and inout port value can be resolved correctly in the chosen partition. The inout port itself is added to the chosen partition's send list and its value changes are sent to other partitions. FIG. 2 shows a design example and FIG. 3 illustrates on how the inout port is handled in the example.

FIG. 2 presents an example design 200 with an inout port 240 shared among top partition 210, partition1 220, and partition2 230. The inout port 240 has three drivers: driver1 245 in partition1 220, driver2 250 in partition2 230, and driver3 255 in top partition 210. The inout port 240 has three loads: load1 260 in partition1 220, load2 265 in partition2 230, and load3 270 in top partition 210.

Figure 3:
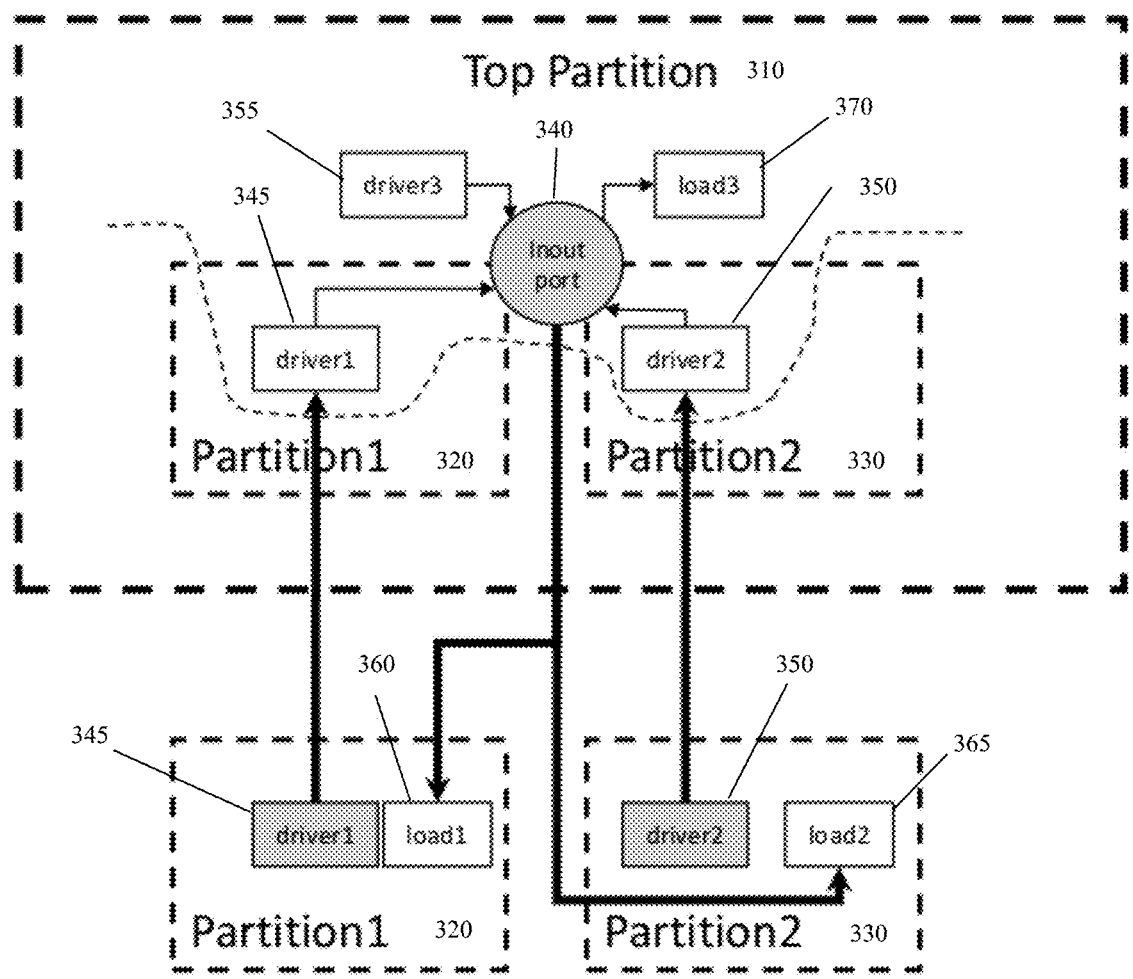
FIG. 3 presents an example on how inout port is handled based on the design shown in FIG. 2. Driver1 in partition1 and driver2 in partition2 are in the send lists of partition1 and partition2, respectively. This allows all drivers of the inout port to have correct values in top partition so that the inout port value can be resolved correctly. The inout port itself is in top partition's send list, and the resolved value is sent to other partitions to drive its loads, load1 and load2, in other partitions.

FIG. 3 presents an example on how inout port is handled based on the design shown in FIG. 2. Driver1 345 in partition1 320 and driver2 350 in partition2 330 are in the send lists of partition1 320 and partition2 330, respectively. This allows all drivers of the inout port to have correct values in top partition 310 so that the inout port value can be resolved correctly. The inout port 340 itself is in top partition's send list, and the resolved value is sent to other partitions to drive its loads, load1 360 and load2 365, in other partitions.

Second, in each partition, inputs (or their loads) of blocks not to be simulated in the current partition are forced to constant values to suppress simulation activities in those blocks. This eliminates simulation workload for portions of the design that are not to be simulated in the current partition. Alternatively, loads of gate terminals in the send list can be forced to constant values to achieve the same goal. Design elements whose values are forced to constant for suppressing downstream simulation activities are called "force list".

Figure 4:
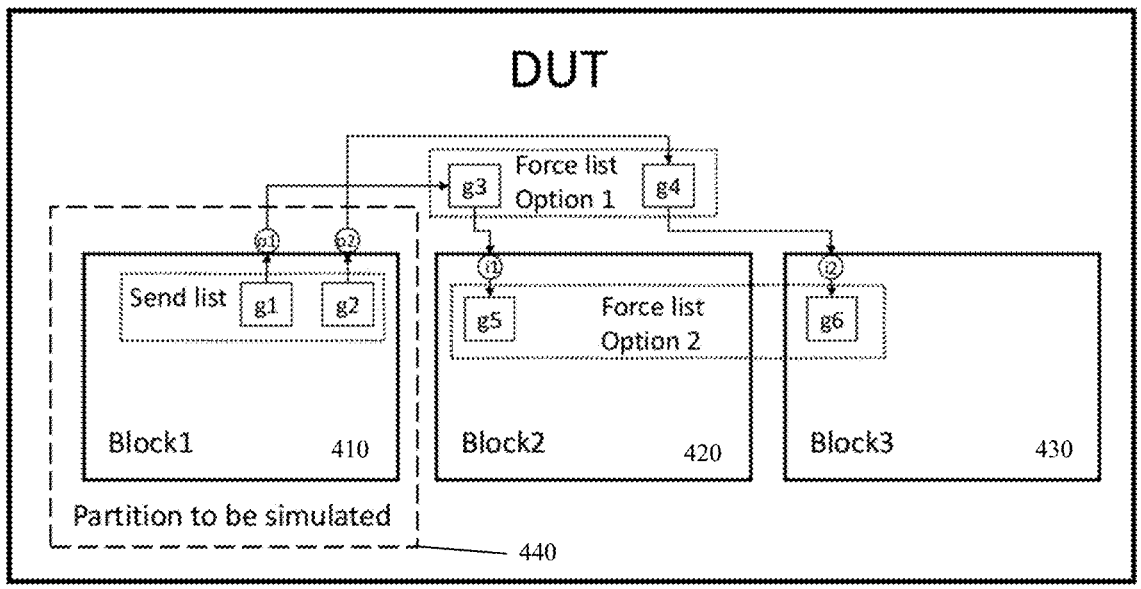
FIG. 4 shows an example of send list and force list. In the example, ports o1 and o2 are in the block that needs to be simulated in the current partition, and their driver gates (g1/g2) are in the send list. Force list is used to suppress activities for blocks not to be simulated in the current partition. Option 1 suppresses activities at loads of block1 outputs. Option 2 suppresses activities at loads of block2/block3 inputs.

FIG. 4 shows a design example with a port, its send list and two possible options of force lists. In the example, ports o1 and o2 are in the block 410 that needs to be simulated in the current partition 440, and their driver gates (g1/g2) are in the send list. Force list is used to suppress activities for blocks 420, 430 not to be simulated in the current partition. Option 1 suppresses activities at loads of block1 outputs. Option 2 suppresses activities at loads of block2/block3 inputs Third, flip flops (FFs) that drive the send list in a partition are identified and monitored during parallel simulation. At a cycle, if no upstream FF has any value change, synchronization points for the current cycle can be skipped because there will not be any value change that need to propagate to other partitions.

Figure 5:
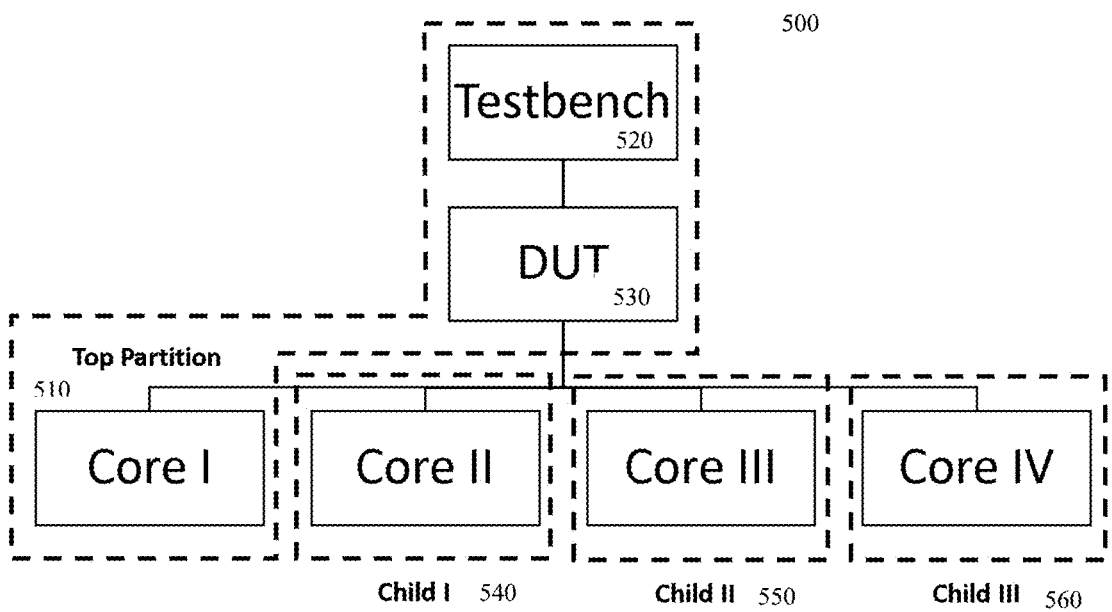
FIG. 5 shows an example partition scheme. Top partition typically includes the testbench and part of the Design Under Test (DUT). Child partitions typically include one or more blocks inside the DUT.

When partitioning the design for parallel simulation, typically one partition will include the testbench and part of the design. All other partitions should include only the design without the testbench. We call the partition that includes the testbench "top partition", and we call other partitions "child partitions". Figure FIG. 5 provides an example of a design 500 after partitioning. Top partition 510 typically includes the testbench 520 and part of the Design Under Test (DUT) 530. Child partitions 540-560 typically include one or more blocks inside the DUT 530.

Figure 6:
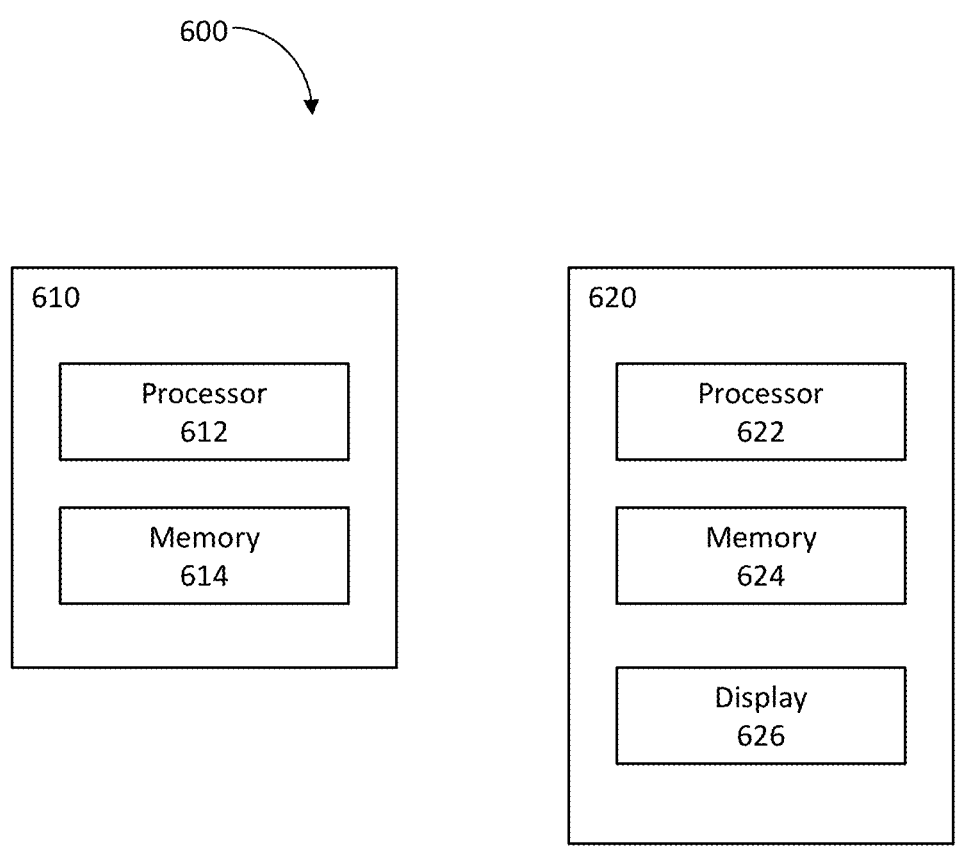
FIG. 6 is a block diagram of a system for implementing the processes and/or subprocesses of FIGS. 2-5.

FIG. 6 is a block diagram of a system 600 for implementing the processes and/or subprocesses described above according to aspects of the disclosure, for example FIGS. 2-5. As shown, the system 600 may include a computing device 610 and a client computing device 620.

The computing device 610 may include at least one processor 612, at least one memory 614, and any other components typically present in general purpose computers. The memory 614 may store information accessible by the processor 612, such as instructions that may be executed by the processor or data that may be retrieved, manipulated, or stored by the processor. The memory 614 and/or processor 612 can be programmed to carry out a set of logical or arithmetic operations. In one example, the logical or arithmetic operations may be stored on a non-transitory computer readable medium. The processor obtains information from memories, performs logical or arithmetic operations based on programmed instructions, and stores the results of the operations into memories. Although FIG. 6 illustrates processor 612 and memory 614 as being within the same block, it is understood that the processor 612 and memory 614 may respectively comprise one or more processors and/or memories that may or may not be stored in the same physical housing. In one example, computer 610 may be a server that communicates with one or more client devices 620, directly or indirectly, via a network (not shown). The computing device 610 can interact with users through input and output devices (not shown), such as keyboards, mouses, disks, networks, displays and printers.

The client computing device 620 may be configured similarly to the computer 610, such that it may include processor 622, a memory 624, and any other components typically present in a general purpose computer. The client device 620 may be any type of computing device, such as a personal computer, tablet, mobile phone, laptop, PDA, etc. In this example, the client device 620 may also include a display 626, such as an LCD, plasma, touch screen, or the like.

The computer executable processing component described in the present disclosure can be executed by the processor(s) of one or more computing devices, such as computing device 610 and/or client computing device 620, or any other computing device.

The foregoing has been a detailed description of illustrative embodiments of the invention. Various modifications and additions can be made without departing from the spirit and scope of this invention. Features of each of the various embodiments described above can be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, while one partition example is shown for illustrative purpose, any design partition can be employed in accordance with the teachings herein. Also, as used herein, the terms "process" and/or "processor" should be taken broadly to include a variety of electronic hardware and/or software based functions and components (and can alternatively be termed functional "modules" or "elements"). Moreover, a depicted process or processor can be combined with other processes and/or processors or divided into various sub-processes or processors. Such sub-processes and/or sub-processors can be variously combined according to embodiments herein. Likewise, it is expressly contemplated that any function, process and/or processor herein can be implemented using electronic hardware, software consisting of a non-transitory computer-readable medium of program instructions, or a combination of hardware and software. Additionally, where the term "substantially" or "approximately" is employed with respect to a given measurement, value or characteristic, it refers to a quantity that is within a normal operating range to achieve desired results, but that includes some variability due to inherent inaccuracy and error within the allowed tolerances of the system (e.g. 1-5 percent). Accordingly, this description is meant to be taken only by way of example, and not to otherwise limit the scope of this invention.

What is claimed is:

1. A method of accelerating a timing-accurate gate-level logic simulation, the method comprising:
    dividing a design into a plurality of partitions;
    for a respective partition of the plurality of partitions with output ports, tracing drivers of all of the output ports at a partition boundary associated with the respective partition until at least one gate terminal is reached, the at least one gate terminal also being a send list for the respective partition;
    for each partition of the plurality of partitions with inout ports, selecting a partition for each inout port, said each inout port being in the send list of the selected partition;
    tracing drivers of the inout port with the respective partition in all remaining partitions until a second at least one gate terminal is reached, the second at least one gate terminal also being a send list for the respective partition;
    identifying a value change associated with the at least one gate terminal, the value change corresponding to a delay;
    transmitting the identified value change to at least one partition of the plurality of partitions;
    forcing all inputs of blocks not to be simulated in a partition, or all loads of terminals in the send list, to a predetermined constant value;
    conducting a parallel simulation;
    monitoring at least one upstream flip flop (FF) that drives send list terminals during the parallel simulation; and
    skipping a synchronization point for a current cycle if at least a value associated with the at least one upstream FF exhibits no change during the monitoring.

2. The method of claim 1, wherein the plurality of partitions are divided along block boundaries.

3. The method of claim 1, wherein delays between signals in the send list and their downstream logic are preserved.

4. The method of claim 1, wherein at least one partition of the plurality of partitions have a testbench.

5. The method of claim 4, wherein the at least one partition having the testbench comprises at least a portion of a design under test (DUT).

6. The method of claim 4, wherein at least one partition of the plurality of partitions do not include a testbench.

7. A system for accelerating a timing-accurate gate-level logic simulation, the system comprising:
    a memory having program instructions stored thereon; and
    a processor configured to:
    divide a design into a plurality of partitions;
    for a respective partition of the plurality of partitions with output ports, trace drivers of all of the output ports at a partition boundary associated with the respective partition until at least one gate terminal is reached, the at least one gate terminal being a send list for the respective partition;
    for each partition of the plurality of partitions with inout ports, select a partition for each inout port, said each inout port being in the send list of the selected partition;
    trace drivers of the inout port with the respective partition in all remaining partitions until a second at least one gate terminal is reached, the second at least one gate terminal also being a send list for the respective partition;
    identify a value change associated with the at least one gate terminal, the value change corresponding to a delay;
    transmit the identified value change to at least one partition of the plurality of partitions;
    force all inputs of blocks not to be simulated in a partition, or all loads of terminals in the send list, to a predetermined constant value;
    conduct a parallel simulation;
    monitor at least one upstream flip flop (FF) that drives send list terminals during the parallel simulation; and
    skip a synchronization point for a current cycle if at least a value associated with the at least one upstream FF exhibits no change during the monitoring.

8. The system of claim 7, wherein the plurality of partitions are divided along block boundaries.

9. The system of claim 7, wherein delays between signals in the send list and their downstream logic are preserved.

10. The system of claim 7, wherein at least one partition of the plurality of partitions have a testbench.

11. The system of claim 10, wherein the at least one partition having the testbench comprises at least a portion of a design under test (DUT).

12. The system of claim 10, wherein at least one partition of the plurality of partitions do not include a testbench.

13. A non-transitory computer readable medium containing program instructions for causing a computer to perform a method of:
    dividing a design into a plurality of partitions;
    for a respective partition of the plurality of partitions with output ports, tracing drivers of all of the output ports at a partition boundary associated with the respective partition until at least one gate terminal is reached, the at least one gate terminal also being a send list for the respective partition;
    for each partition of the plurality of partitions with inout ports, selecting a partition for each inout port, each said inout port being in the send list of the selected partition;
    tracing drivers of the inout port with the respective partition in all remaining partitions until a second at least one gate terminal is reached, the second at least one gate terminal also being a send list for the respective partition;
identifying a value change associated with the at least one gate terminal, the value change corresponding to a delay;
transmitting the identified value change to at least one partition of the plurality of partitions;
forcing all inputs of blocks not to be simulated in a partition, or all loads of terminals in the send list, to a predetermined constant value;
conducting a parallel simulation;
monitoring at least one upstream flip flop (FF) that drives send list terminals during the parallel simulation; and
skipping a synchronization point for a current cycle if at least a value associated with the at least one upstream FF exhibits no change during the monitoring.

14. The non-transitory computer readable medium of claim 13, wherein the plurality of partitions are divided along block boundaries.

15. The non-transitory computer readable medium of claim 13, wherein delays between signals in the send list and their downstream logic are preserved.

16. The non-transitory computer readable medium of claim 13, wherein at least one partition of the plurality of partitions have a testbench.

17. The non-transitory computer readable medium of claim 16, wherein the at least one partition having the testbench comprises at least a portion of a design under test (DUT).

18. The non-transitory computer readable medium of claim 16, wherein at least one partition of the plurality of partitions do not include a testbench.

* * * * *